United States Patent [19]
Tuffet et al.

[11] 3,976,970
[45] Aug. 24, 1976

[54] PROCESS AND DEVICE FOR ANALIZING AND VALIDATING SIGNALS USABLE IN WARNING SYSTEMS FOR ROAD-SIGNS

[76] Inventors: Pierre Edmond Tuffet, 7 rue du Marechal Foch, Tarbes (Hautes Pyrenees); Bernard Paul Cuq, Cite Amouroux, batiment C 44, Apt. 911; Jean Margot, 5 rue de Castanet, both of 31500 Toulouse, all of France

[22] Filed: Dec. 2, 1974

[21] Appl. No.: 528,640

[30]  Foreign Application Priority Data
Dec. 7, 1973  France ............................. 73.43683

[52] U.S. Cl.............................. 340/32; 340/167 R; 340/221
[51] Int. Cl.$^2$ .......................................... G08G 1/00
[58] Field of Search ....................................... 340/32

[56]  References Cited
  UNITED STATES PATENTS

| | | | |
|---|---|---|---|
| 1,803,292 | 4/1931 | Adler | 340/32 |
| 2,493,755 | 1/1950 | Ferrill | 340/32 |
| 3,493,923 | 2/1970 | Stevens | 340/32 |
| 3,668,624 | 6/1972 | Spaulding | 340/32 |
| 3,753,223 | 8/1973 | Fayling | 340/32 |
| 3,775,743 | 11/1973 | Carter | 340/32 |

FOREIGN PATENTS OR APPLICATIONS

| | | | |
|---|---|---|---|
| 1,492,169 | 7/1967 | France | 340/32 |

*Primary Examiner*—Thomas B. Habecker
*Attorney, Agent, or Firm*—Young & Thompson

[57]  ABSTRACT

Two orientated magnetic field generating means such as permanent magnets are embedded in a roadway at some distance from each other before a road-sign, said magnets extending on the whole width of the roadway. When a vehicle equipped with a detector crosses said magnets, signals of pseudo-sinusoidal shape are generated. Said signals are applied to elements converting them to calibrated pulses corresponding to the two alternations of the signals. The order of said ulses is checked to validate only pulses appearing in a predetermined order, thus eliminating direction ambiguity. The time separating two pulses is also checked to validate only pairs of pulses comprised in a predetermined time period, thus eliminating interferences from outside. The pairs of pulses are transmitted to at least one time window circuit which is adjusted to a predetermined period of time. Only pairs of pulses appearing within said predetermined period are validated. Said pairs of pulses are counted and their number is compared with a predetermined number; they are then transmitted to a warning device. By providing two time window circuits adjusted to different periods of time, the system can be used both for indicating road-signs and as a kinemometer, the two magnets being then separated by a distance which is a function of the authorized speed.

6 Claims, 6 Drawing Figures

MAGNETIC FIELD DETECTOR

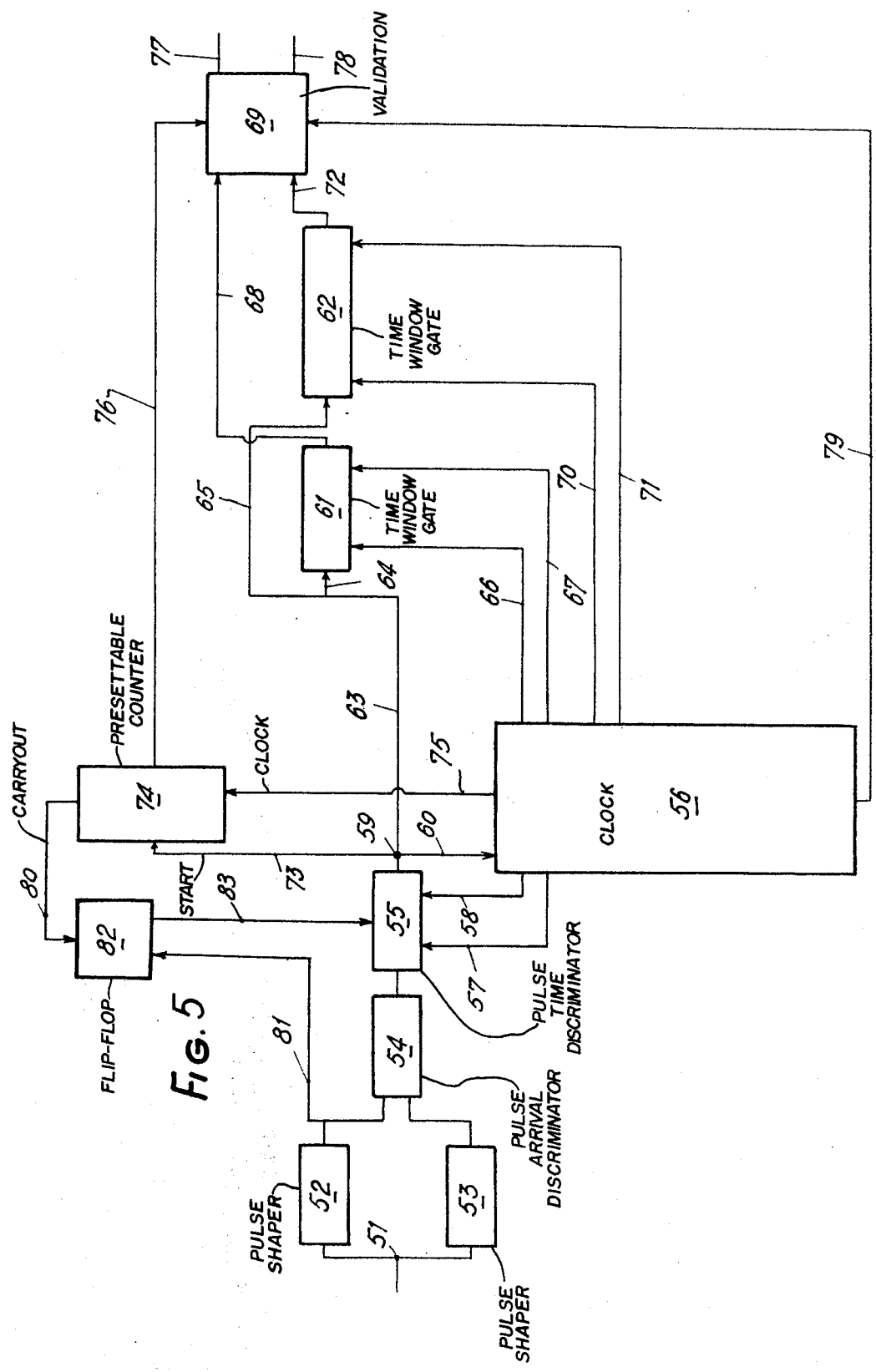

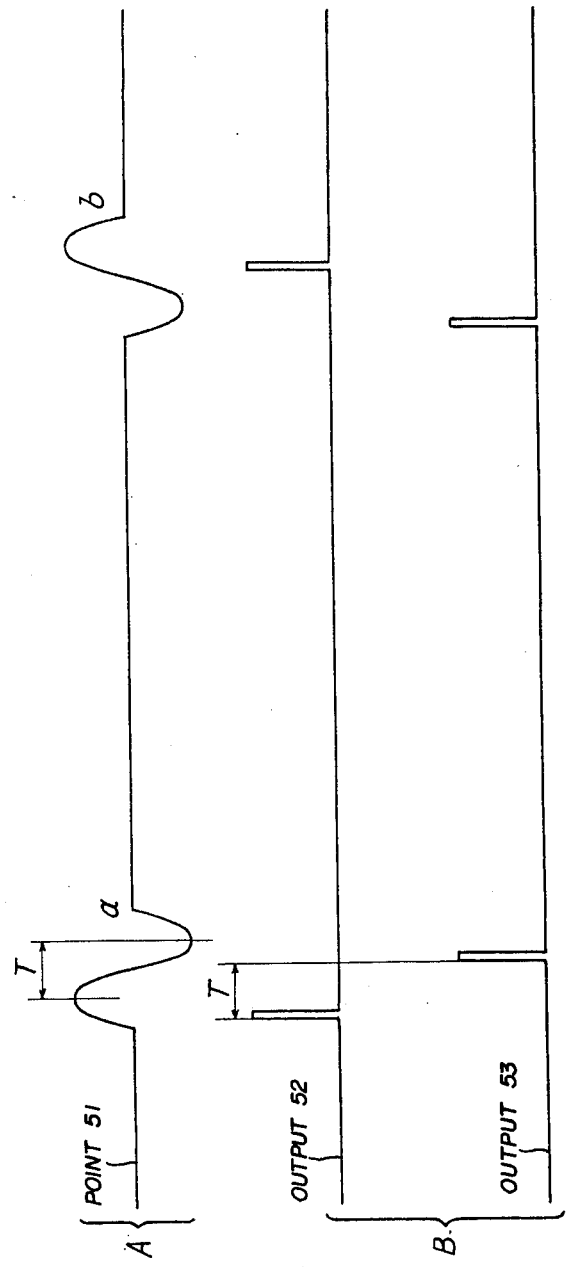

PROCESS AND DEVICE FOR ANALIZING AND VALIDATING SIGNALS USABLE IN WARNING SYSTEMS FOR ROAD-SIGNS

The present invention relates to a road-sign warning system and is particularly concerned with a road-sign warning system for automotive vehicles.

The traffic conditions of today and particularly those that will occur in the future do not permit a driver to analyse the situation in which he finds himself with the necessary rapidity and reliability. Whether this is due to the increasing number of vehicles and of their speeds, to the distractions of the areas through which the vehicle is travelling, to the presence of passengers in the vehicle or to the occular or general fatigue of the driver resulting from a long journey or travelling through the night in conditions of bad visibility, the driver's capacity to analyse the situation and conditions in which he finds himself is greatly affected or reduced. These conditions result in the driver of a vehicle, in too many cases, failing to see boards and panels carrying road signs. Such failure may result in great danger.

The object of the invention is to overcome this difficulty by providing a system fitted inside the vehicle and providing the driver with a warning when he approaches a road sign.

It has already been proposed, as disclosed in U.S. Pat. No. 3,609,678, dated Sept. 28, 1971, to provide magnet installations on roadways, more specifically magnets disposed across the roadway, and detector means located on a vehicle. When the vehicle is crossing over the magnets, a signal is generated and an alarm is provided for the driver. According to that Patent, orientated magnets can be embedded within the roadway, in order to provide the driver of a vehicle with an alarm signal when the vehicle is crossing over said magnet in a "wrong" direction, while no signal is generated when the vehicle is driving in the "right" direction.

However, this system is insufficient under the present conditions of traffic, and is not able selectively to provide alarm signals in certain circumstances, for instance in case of a speed-limit condition applied to a portion of a roadway.

It has also been proposed, as disclosed in U.S. Pat. No. 3,493,923, dated Feb. 3, 1970, to provide a road-to-driver communication system including coded groups of permanent magnets located in the roadway to radiate polarized fields above the roadway surface and to provide on the vehicle a sensor for detecting said fields when the vehicle is crossing the same. The sensor generates a signal which can be detected for display purposes.

However, the system as disclosed in the latter patent is complicated and requires a relatively large number of magnets being embedded in the roadway, whereby the device provided on the vehicle must also be of complicated structure in order to provide the driver with some useful information.

Obviously, it is not possible to require from the vehicle owners that they spend a relatively high sum for the equipment of their vehicle. Moreover, the expense corresponding to the infrastructure which is required for the roadway would also be relatively high. Therefore, such a system is not practically usable.

It will be easily understood that a road-sign warning system must be of simple construction, sufficiently cheap both as regards the system infrastructure to be provided on the roadway and the equipment required on the vehicle, and of a reliable functioning.

It is an object of the invention to provide a road-sign warning system which satisfies all these conditions.

Another object of the invention is to provide a unitary system capable both of giving a vehicle driver a warning when he approaches a road-sign indicating some road conditions such as a crossing, a stop or the like, and also of giving the driver an indication when he will enter a speed-limit zone in case he is driving at a speed higher than the authorized speed.

Still another object of the invention is to provide a unitary system comprising at least two magnetic field generators located in or on the roadway at a suitable distance from each other and detector and signal generating means provided on the vehicle and capable of giving the driver a different warning signal when he approaches a road-sign indicating some road conditions, such as a crossing, and when he will enter a speed-limit zone, whereby said different signals are generated merely by changing the distance between said magnetic field generators provided in the roadway.

Still another object of the invention is to provide means for analysing the signals generated when the vehicle crosses over the magnetic field generators provided on the roadway, in order to provide the driver with different warning signals when the vehicle is approaching a road-sign panel and when it enters a speed-limit zone.

The invention will now be described in detail with reference to the attached drawings in which:

FIG. 5 is a circuit diagram of an arrangement corresponding to one embodiment of the circuits provided on the vehicle.

FIG. 6 is an explanatory diagram showing the signals and the pulses.

Figure 1:
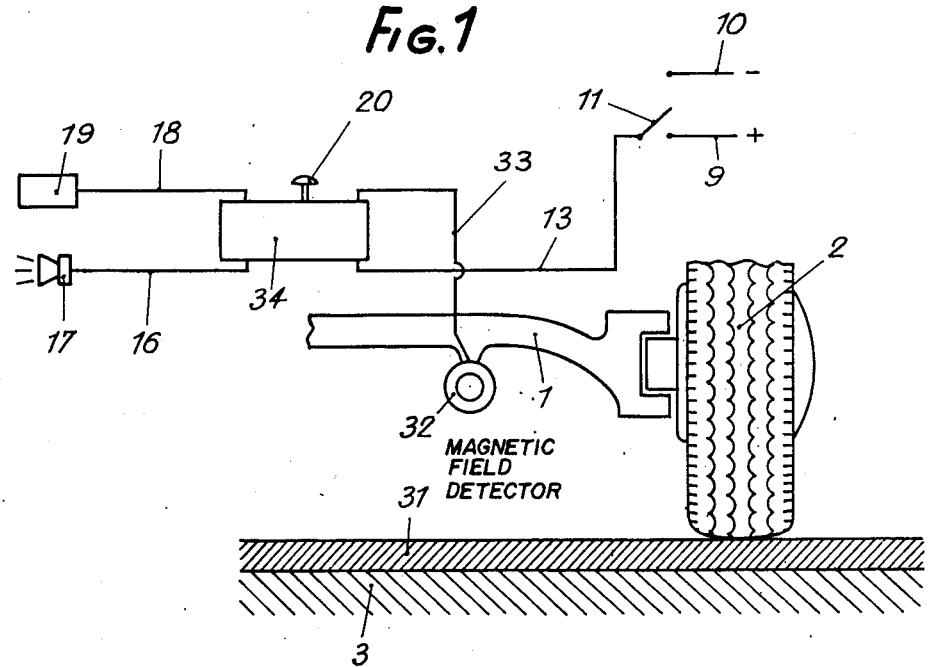
FIG. 1 is a schematic view of an embodiment of the invention showing the means provided on the vehicle and in the roadway.

Referring now to FIG. 1, reference numeral 3 designates the surface of the road on which is travelling a vehicle the chassis of which is shown at 1 and one wheel at 2.

In this embodiment, one magnet 31 of naturally occurring magnetic material is embedded in the road surface 3 and the vehicle is provided with a magnetic field detector 32 connected through a wire 33 to a control circuit 34, which will be described hereinafter. The position of the detector 32 on the chassis 1 is arranged for said detector, which can be for instance a loop or winding, being energized when the vehicle passes over the magnet 31.

Reference numerals 9 and 10 designate the supply wires of the system, while 11 indicates an electric switch connected through a wire 13 to the control circuit 34, which is connected by a wire 16 to an audible warning device 17, the numeral 18 indicating a wire terminating at the luminous or light indicator 19.

A Button for bringing the system to the operative condition is indicated at 20.

Figure 2:
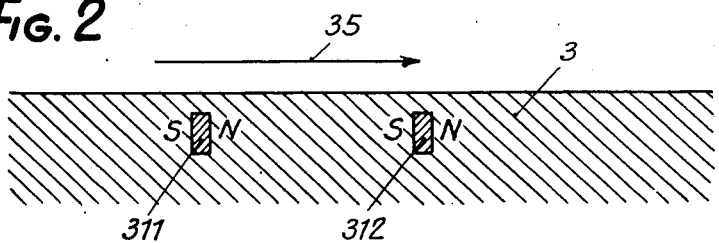
FIG. 2 is a schematic explanatory view.

In the embodiment as disclosed herein, there is provided in the roadway two permanent magnets 311 and 312 extending over the whole width of the roadway in order to constitute two magnetic field generators and arranged in the manner shown in FIG. 2, so that a vehicle driving in the direction shown by the arrow 35 first meets the South pole of the magnets.

A general description of the circuit provided on the vehicle and of its operation will be first given with respect to FIGS. 1-3, while a more detailed description will be given in connection with FIGS. 5 and 6.

The control circuit means indicated at 34 in FIG. 1 comprises two gates which are connected by wire 33 to the detector 32. Said gates are illustrated at 36 and 37 in FIG. 3 as a logical diagram. The first gate 36 is connected by wire 16 to the audible warning device 17 to operate the same, while the second gate 37 is connected to operate both the audible device 17 and the luminous device 19 through wires 18 and 16. The amplification stages of the circuit are not shown since they are well-known in this technical field.

Both gates are arranged to be opened, in the present case, only by a south pole detected by the detector 32 provided on the vehicle. The opening of the gates is indicated at A in FIG. 3. The first gate 36 has an open time period "t" and closes at B in FIG. 3, said open time being for instance 50 milliseconds, and the second gate 37 has an open time period T and closes at C in FIG. 3, said open time being for instance 200 milliseconds.

The disclosed system operates as follows:

When the driver should be warned of a road condition sign such as a sign indicating a crossing, the two magnets 311 and 312 are located in the roadway at a very short distance from each other. When the vehicle passes over the first magnet 311 in the direction indicated by the arrow 35 in FIG. 2, gate 36 is opened by the South pole of said magnet 311. Said gate 36 remains open during the time period $t$. Since the two magnets are very close to each other, said gate 36 is still open when the vehicle passes over the second magnet. Therefore, the second electric pulse generated by the detector 32 will be transmitted by this gate 36 and will energize the audible warning device 17 through the amplication stages of the control circuit 34 and wire 16. In order to interrupt the warning, the driver whose attention has thus been called to the road-sign must push the botton 20. If desired, the warning signal can be interrupted only after a few seconds when the button 20 has been pushed.

Another vehicle passing over the magnets 311 and 312 in the reverse direction will meet North poles, so that no energization or opening of the gates will be produced.

When the driver of a vehicle should be warned of a speed limit condition, two magnets 311 and 312 are embedded in the roadway at a distance from each other which is a function of the limited speed. For instance, if the speed limit is 45 kilometers per hour, the distance between the magnets can be 5 meters for the open periods of the gates as indicated hereinbefore.

Figure 3:
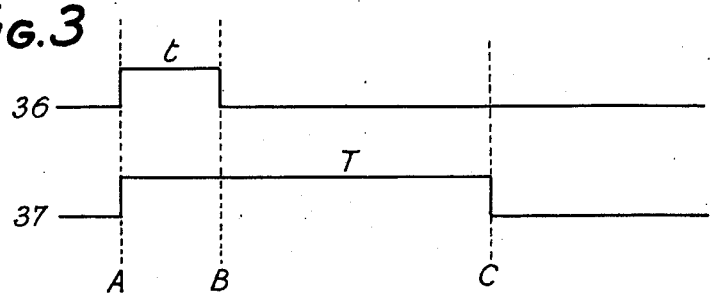
FIG. 3 is a diagram showing the open times of the two gates of the system according to one embodiment.

When considering FIG. 3 it is shown that when the vehicle passes over the first magnet, both gates are opened as indicated at A. However, the electronic circuit is arranged in such a way that the emitted pulse can be transmitted by gate 37 only when the gate 36 has closed. Therefore, the transmitting condition of gate 37 is comprised between B and C in FIG. 3. The time period $t$ is chosen with respect to T and to the distance separating the two magnets in order that, normally, an automotive vehicle is unable to cover said distance in the time period $t$. Therefore, the system operates as follows:

If a vehicle is driving at a speed which is equal to or lower than the speed limit, said vehicle passes over the second magnet after a time duration longer than the time T after having passed over the first magnet. Therefore, gate 37 has already closed before this passing of the vehicle over the second magnet and the pulse detected by the detector 32 of the vehicle is not transmitted by gate 37, so that no warning is given to the driver of said vehicle.

If the vehicle is driving at a speed higher than the limited speed, said vehicle is passing over the second magnet during the time period T, so that gate 37 is still open, and a pulse corresponding to the detection of said second magnet by detector 32 is transmitted through gate 37 to the warning devices 19 and 17, so that a warning is given to the driver of the vehicle running at too high a speed.

Figure 4:
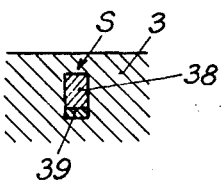
FIG. 4 is a detailed view corresponding to another embodiment of the invention.

As for the preceding example, the magnets extend over the whole width of the roadway. In case a warning should be produced only when a vehicle is driving in a given direction, the magnets provided in the roadway are of the type shown and described with respect to FIG. 2, so that vehicles passing over said magnets in the other direction do not give rise to a warning signal. However, if a speed-limit warning signal should be provided in both directions, use can be made of magnetic field generators such as disclosed and shown in FIG. 4, wherein a magnet 38 is provided with a shunt 39 in order that a South pole be detected by vehicles passing over said magnet in both directions. In such a case, a speed-limit warning signal is obtained for vehicles driving over the roadway in both directions.

It is thus seen that the disclosed arrangement provides a warning for road-signs and for speed-limits with simple means and while using a single system on the vehicle, this system being cheap and of a simple construction.

A more detailed description will be given hereinafter while referring to FIGS. 5 and 6.

The system here described comprises as disclosed hereinbefore two orientated magnetic field generators or magnets embedded in the roadway and a detector, a control circuit and warning signal generating means provided on the vehicle.

The magnets generate pseudo-sinusoidal signals which may be of one or the other type indicated at A in FIG. 6. The signal $a$ first has a positive alternation, then a negative alternation, while the signal $b$ first has a negative alternation and then a positive alternation. These signals result from the crossing of a magnet in opposite directions respectively. When such a signal is generated by the crossing of a magnet by the vehicle, in the manner described hereinbefore, it appears on the conductor 51 (FIG. 5) and it is applied to two circuits 52 and 53 which are in parallel. These circuits ensure a shaping of the signals so as to supply pulses calibrated in amplitude and in time and represented by rectangular waves at B in FIG. 6. It can be seen that in the case of the signal $a$ there is obtained a rectangular wave corresponding to the positive alternation of the signal, then a rectangular wave corresponding to the negative alternation, while the order is reversed in the case of the signal $b$. In the present instance, the circuit 52 ensures the shaping of the positive alternations of the signal and the circuit 53 the shaping of the negative alternations. Such shaping circuits are well known in the art.

The resultant shaped pulses are applied separately, as can be seen in FIG. 5, to a well known chronological discriminating circuit 54, which transmits only the pairs of pulses arriving in a given order. (It will be assumed here that this circuit transmits the pairs of pulses corresponding to a positive alternation and then to a negative alternation, which forms the signal $a$ in FIG. 6). The pairs of pulses of opposite order are arrested. In this way, a resolution of ambiguity of direction is achieved, inasmuch as for a magnetic barrier embedded in the roadway only the signals generated by vehicles crossing this barrier in the desired direction will be validated, while the other signals will be eliminated.

The pair of pulses transmitted by the pulse arrival discriminating circuit 54 is then applied to a well known circuit 55 checking the time separating the two pulses of each pair. This circuit receives from a well-known clock 56, through conductors 57 and 58, two items of information, a minimum time and a maximum time which may normally separate two pulses of the same pair. These times are chosen arbitrarily by the operator according to the configuration of the magnets. By way of example, they may be 1 millisecond and 35 milliseconds. Taking account of this bracket, for a given configuration of magnet all the pairs of pulses resulting from the crossing of this magnet by a vehicle will normally be located within the said bracket and this enables pairs of pulses which may result from interference signals outside this bracket to be excluded. When the second pulse of a pair passes through the pulse time discriminating circuit 55 it immediately closes this circuit before the expiration of the time bracket. The clock is started or triggered in this case by the first pulse received, which having passed through the circuit 55, arrives at 59 and is applied to the clock by way of a conductor 60. The second pulse of the pair is transmitted by the circuit 55 only if it is contained within the aforesaid time bracket extending in the present case from 1 to 35 milliseconds.

The pair of pulses having satisfied the order and time checks ensured by the circuits 54 and 55 therefore appears at the point 59.

In the example considered, according to whether the system operates as a road sign detector or as a kinemometer, the arrangement includes two well-known time window or gate circuits, designated here by the reference 61 and 62, ensuring a check on the time separating two pairs of pulses. Judiciously, these circuits 61 and 62 process the second pulses of each pair to take account of the validation ensured by the circuit 55.

From the point 59 (FIG. 5) there departs a common conductor 63 which is connected by a conductor 64 to the circuit 61 and by a conductor 65 to the circuit 62, these circuits being arranged in parallel.

In the example considered, the circuit 61 comes into action to validate two pairs of pulses originating from two close magnets intended to indicate a "condition" of the road, such as an intersection, etc. This circuit 61 receives from the clock 56, through two conductors 66 and 67, respectively, pulses at the times To and Tl reckoned from the starting of the clock 56, defining a time window. In the present case, these pulses are a function of the distance separating two magnets. In practice, this distance and these times will be chosen in such manner that the second pair of pulses supplied through the crossing of the second magnet by the vehicle always appears during this window, even if the vehicle is travelling slowly. These times To and Tl may be respectively equal, for example, to 7.2 ms and 90 ms.

If the second validated pulse of negative alternation appears during this window, it is transmitted by the circuit 61 and applied by a conductor 68 to a well-known validation circuit 69, e.g. a flip-flop, the function of which will be indicated hereinafter.

In the example considered, the circuit 62 processes the pairs of pulses originating from the crossing of two magnets spaced from one another by a distance which is a function of a speed limit. Thus, if the speed is limited, for example, to 45 km/hour, the distance separating the two magnets may be, for instance, 5 meters. This circuit receives from the clock 56, through conductors 70 and 71, two pulses at the times T1 and T2, again defining a time window in this case. The time of opening of the circuit 62 corresponds to the time of closing of the circuit 61, so as to avoid any ambiguity. For a speed limited to 45 km/hour and a distance of 5 meters between the magnets, the time of closing T2 of the circuit 62 will be 400 milliseconds. (The times T1 of 90 milliseconds and T2 of 400 milliseconds are reckoned from the passage of the pulse of positive alternation of the signal).

The second pulse of the second pair transmitted by the circuit 62 is then applied by a conductor 72 to the aforesaid validation circuit 69.

From the point 59, the first pulse of the first pair of pulses is applied through a conductor 73 to a well-known counting circuit 74, the counting cycle of which is thus started. A conductor 75 ensures the application to this circuit 74, from the clock 56, of a stop pulse at the time corresponding to the longest time which is to separate the pairs of pulses which can be validated, which is 400 milliseconds in the example being considered. During this time, the circuit 74 counts the pairs of pulses appearing at the point 59. A desired number is set in by the operator in the presettable counter circuit 74. In the present case, since the operation of the system is based on the crossing of two magnets, the number set in will be 2. It is obvious that this may be different for systems of different design.

If the number of pairs of pulses received during the time considered is equal to 2, the circuit 74 applies a validating pulse to the circuit 69 at the end of this time through a conductor 76 and this validates the pulse transmitted to the latter circuit through the conductor 68 or 72 and kept waiting in the said circuit 69.

It will also be noted on examining FIG. 5 that a conductor 79 starting from the clock 56 is connected to the circuit 69. At the end of the aforesaid time corresponding to the longest time which is to separate pulses which can be validated, which corresponds to the end of the working cycle of the arrangement, a pulse is applied by the clock 56 and through the conductor 79 to the circuit 69. This pulse triggers by means of its leading edge the transmission of the pulse validated in the circuit 69, through a conductor 77 or 78, to a warning device which is different according to whether this pulse comes from the circuit 61 or the circuit 62, in order to give a different warning in each case to the driver of the vehicle. Then, the pulse transmitted through the conductor 79 ensures, by its trailing edge, the return of the circuits of the arrangement to their initial state.

If the number of pairs of pulses is less than 2, the result is not validated by the counting circuit 74. It may be assumed that this is a question of an isolated interference and no validation occurs.

As indicated in the drawing, a conductor 80 connects the counting circuit to a well-known "monostable multivibrator" circuit 82 which is also connected by a conductor 81 to the circuit 52 (or 53) so as to receive therefrom the generated pulses, and which is moreover connected to the circuit 55 so as to apply inhibit pulses thereto as indicated hereinafter.

If the number of pairs of pulses is higher than the predetermined number, therefore higher than 2 in the present case, the counting circuit 74, on reception of the third pair of pulses, activates the monostable multivibrator circuit through the carry out conductor 80. Immediately it is activated, this flip-flop circuit 82 takes account of the pulses leaving the circuit 52 (or the circuit 53) and applied through the conductor 81. (The chronology of the signals resulting from the positive or negative alternation of the pair of pulses has no effect on the operation of the flip-flop circuit 82).

Immediately it is activated, the circuit 82 acts on the circuit 55 through the conductor 83 so as to inhibit the validation of the pairs of pulses at the point 59 and thus their conveyance by means of the conductors 60, 63 and 73. This inhibition lasts as long as the phenomenon which has caused the activation of the circuit 82 exists and moreover persists for a minimum time equal to the maximum time of the bracket of the circuit 55, that is in this case 35 ms, plus an arbitrary time ϵ which may be 15 ms in the present case, that is a total time of 50 ms after the last pulse leaving the circuit 52 (or the circuit 53).

It can thus be seen that, due to this arrangement, and as will be understood by reading the foregoing description, the apparatus ensures the elimination of isolated interferences or trains of interferences, by validating only the pairs of pulses originating from the magnets, and it does away with possible ambiguities.

Modifications may be made in the ways of carrying the invention into effect which have been described, within the scope of technical equivalence, without departing from the invention.

Thus the system with which the invention is concerned may be used in radio guiding installations. For this purpose, electromagnets for instance may be incorporated in the roadway, the coils of them being selectively activated by a simple low power transmitter (an elementary zonal emitter) and the equipment provided on the vehicle being completed by a single-frequency micro-receiver for example, which may incorporate, in addition to the conventional H.F. amplification stages and detection stages corresponding to the characteristics selected for the elementary zonal emitter, a speech circuit and a selective audio-frequency chopped resonant circuit, that of the two circuits in use feeding a loud-speaker in the vehicle.

If the transmitter is in service, the coils of the magnet are activated to transmit on a selected frequency, the spoken message relating to the zone in which the vehicle or vehicles for whom the message is intended is/are travelling. When the vehicle passes above an activated electro-magnet, its receiver is automatically brought into action. Simultaneously, the receiver detects the radio signals from the transmitter and actuates its speech circuit, and the spoken message is reproduced by the loud-speaker contained in the vehicle. When the message has been understood, the driver actuates a button for bringing the system to the watching condition. If the electromagnet is not activated, nothing happens. If the vehicle passes over a permanent magnet in the road surface, the receiver is again brought into service, but since it is detecting nothing the audio-frequency chopped resonant circuit is itself in service and a normal audible warning is given to the driver.

What is claimed is:

1. A road-sign warning system for a vehicle, comprising first and second orientated magnetic means to generate localized magnetic fields, provided in the road at some distance from each other, sensor means arranged on said vehicle, said sensor means generating a signal of sinusoidal shape when the vehicle is passing over one of said magnetic means, means for converting said signal into a pair of pulses corresponding to the two alternations of said signal, arrival order means for checking the arrival order of said pulses and for transmitting said pulses only when the pulses follow one another within a predetermined order and time period, means for receiving said successive pairs of pulses transmitted by said arrival order means, for checking the time separating said pair of pulses, and for transmitting only pairs of pulses contained within a predetermined time period, at least one time window means for transmitting successive pairs of pulses contained within a predetermined time window, a counting means counting the pairs of pulses transmitted by said arrival order means and passing the output of the time window means if this number corresponds to a predetermined number of pairs of pulses, and warning means for receiving said passed pulses and emitting a warning signal.

2. A road-sign warning system according to claim 1, comprising a clock for supplying the time brackets and time windows for said receiving means and said at least one time window means.

3. A road-sign warning system according to claim 1, said window means comprising two time window circuits in parallel, adjusted to different time windows selectively to pass pairs of pulses separated by different time periods.

4. A road-sign warning system according to claim 1, said window means comprising a first time window circuit adjusted to a first time window for transmitting pulses originating from two successive magnetic means which are located at a short distance from each other, for giving a warning of a road-sign corresponding to a road condition, and a second time window circuit adjusted to a second time window for transmitting pulses originating from two successive magnetic means located in the roadway at a distance depending on a speed-limit condition and generated when a vehicle passes over said magnetic means at a speed exceding said speed-limit, said first and second time window circuits being parallel connected for the selective transmission of a pair of pulses.

5. A road-sign warning system comprising orientated magnets embedded in the roadway to generate magnetic fields, a sensor mounted on a vehicle, said sensor generating a sinusoidal shaped signal when crossing said magnets, means for converting said signal to calibrated pulses, means for checking the order of said pulses and comparing them with a predetermined order and passing only those pairs of pulses appearing in the predetermined order, means for checking the time separating said pulses and passing only those pairs of pulses comprised within a predetermined time period, a radio receiver on said vehicle, a zonal emitter provided in the system outside the vehicle, means for energizing said receiver through said pairs of pulses, and a loudspeaker provided on the vehicle in order that energization of said receiver transmits to the driver of the vehicle an audible signal emitted by said emitter.

6. A road-sign warning system according to claim 5, wherein said magnets embedded in the roadway are electromagnets having coils which can be selectively activated by said emitter for transmitting an audible signal to an equipped vehicle crossing said electromagnets.

* * * * *